United States Patent
Felmlee et al.

(10) Patent No.: US 6,469,506 B1
(45) Date of Patent: Oct. 22, 2002

(54) AUTOCORRECTION OF MR IMAGES ACQUIRED USING PHASED-ARRAY COILS

(75) Inventors: Joel P. Felmlee; Kiaran P. McGee; Richard L. Ehman; Armando Manduca, all of Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 140 days.

(21) Appl. No.: 09/595,272

(22) Filed: Jun. 15, 2000

Related U.S. Application Data

(60) Provisional application No. 60/166,432, filed on Nov. 19, 1999.

(51) Int. Cl.$^7$ ................................................. G01V 3/00
(52) U.S. Cl. ........................ 324/309; 324/307; 324/312
(58) Field of Search ................................ 324/309, 307, 324/306, 308, 310, 311, 312, 300, 313, 314, 318, 322

(56) References Cited

U.S. PATENT DOCUMENTS

| | | | | |
|---|---|---|---|---|
| 5,086,275 A | * | 2/1992 | Roemer | 324/309 |
| 6,184,682 B1 | * | 2/2001 | Ehman et al. | 324/309 |
| 6,265,874 B1 | * | 7/2001 | McGee et al. | 324/309 |
| 6,307,369 B1 | * | 10/2001 | Felmlee et al. | 324/309 |
| 6,329,819 B1 | * | 12/2001 | Manduca et al. | 324/309 |

FOREIGN PATENT DOCUMENTS

WO    WO99/53444    * 10/1999

OTHER PUBLICATIONS

Autofocusing of Clinical Shoulder MR Images for Correction of Motion Artifacts, Mayo Clinic, Rochester MN, Manduca, et al.
Automatic Correction of Motion Artifacts in Magnetic Resonance Images Using an Entropy Focus Criterion, IEEE Transactions on Medical Imaging, vol. 16, No. 6, Dec. 1997, Atkinson, et al.
An Autofocus Algorithm for the Automatic Correction of Motion Artifacts in MR Images, Lecture Notes in Computer Science, 15$^{th}$ International Conference, IPMI '97, Atkinson, et al.
A Respiratory Motion Artifact Reduction Method In Magnetic Resonance Imaging of the Chest, IEEE Transactions on Medical Imaging, vol. 10, No. 1, Mar. 1991, Atalar, et al.
Motion Artifact Suppression: A Review of Post–Processing Techniques, MRI, vol. 10, pp 627–635, 1992, Hedley, et al.
Diffusion–Weighted Multiple Shot Echo Planar Imaging of Humans without Navigation, MRM 38 82–88 1997, Robson, et al.
MRI Artifact Cancellation Due to Rigid Motion in the Imaging Plane, IEEE Transactions on Medical Imaging, vol. 15, No. 6, Dec. 1996, Zoroofi, et al.
An Improved Algorithm for 2–D Translation Motion Artifact Correction, IEEE Transaction on Medical Imaging, vol. 10, No. 4, Dec. 1991, Hedley, et al.

* cited by examiner

*Primary Examiner*—Edward Lefkowitz
*Assistant Examiner*—Tiffany A. Fetzner
(74) *Attorney, Agent, or Firm*—Quarles & Brady, LLP

(57) ABSTRACT

An MRI image acquired with a phase-array coil is corrected for motion artifacts using an iterative, autocorrection process in which corrections are tried and the quality of the resulting reconstructed image is measured. In one embodiment autocorrections are calculated for the data acquired with one coil element and the same corrections are made to data acquired with the other coil elements. In another embodiment autocorrections are calculated separately for the data acquired with each coil element. In either embodiment, the separate corrected images are combined to form the output image.

4 Claims, 3 Drawing Sheets

AUTOCORRECTION OF MR IMAGES ACQUIRED USING PHASED-ARRAY COILS

RELATED APPLICATIONS

This application claims benefit of provisional application Serial No. 60/166,432 filed on Nov. 19, 1999.

BACKGROUND OF THE INVENTION

The field of the invention is nuclear magnetic resonance imaging methods and systems. More particularly, the invention relates to the autocorrection of motion artifacts in MR images acquired using phased-array coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the objects functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

The most successful method for correcting MR images for motion artifacts employs navigator signals acquired during the scan. As described in U.S. Pat. No. 4,937,526, such navigator signals are acquired periodically during the scan, and the information in these signals may be used to correct the image data for patient motion. Unfortunately, acquisition of the navigator signals increases the scan time.

More recently an automatic correction method has been developed in which the acquired image is iteratively corrected and measured against a quality metric. Termed "autocorrection", this method systematically tries different phase correction on the image data and measures the quality of the resulting image. This is done in an iterative process that drives the image quality towards the highest possible quality.

SUMMARY OF THE INVENTION

The present invention relates to improvements in the autocorrection approach which make it a practical tool for the correction of clinical images acquired using phase-array coils. Separate k-space image data sets are acquired with each coil element in a phase-array coil. Autocorrection is employed on one of the k-space image data sets, and the resulting phase corrections are made to all of the acquired k-space image data sets. In the alternative, autocorrection may be applied separately to each of the acquired k-space image data sets. In either case, the corrected image data sets are combined to produce a single corrected image.

DESCRIPTION OF THE PREFERRED EMBODIMENT

Figure 1:
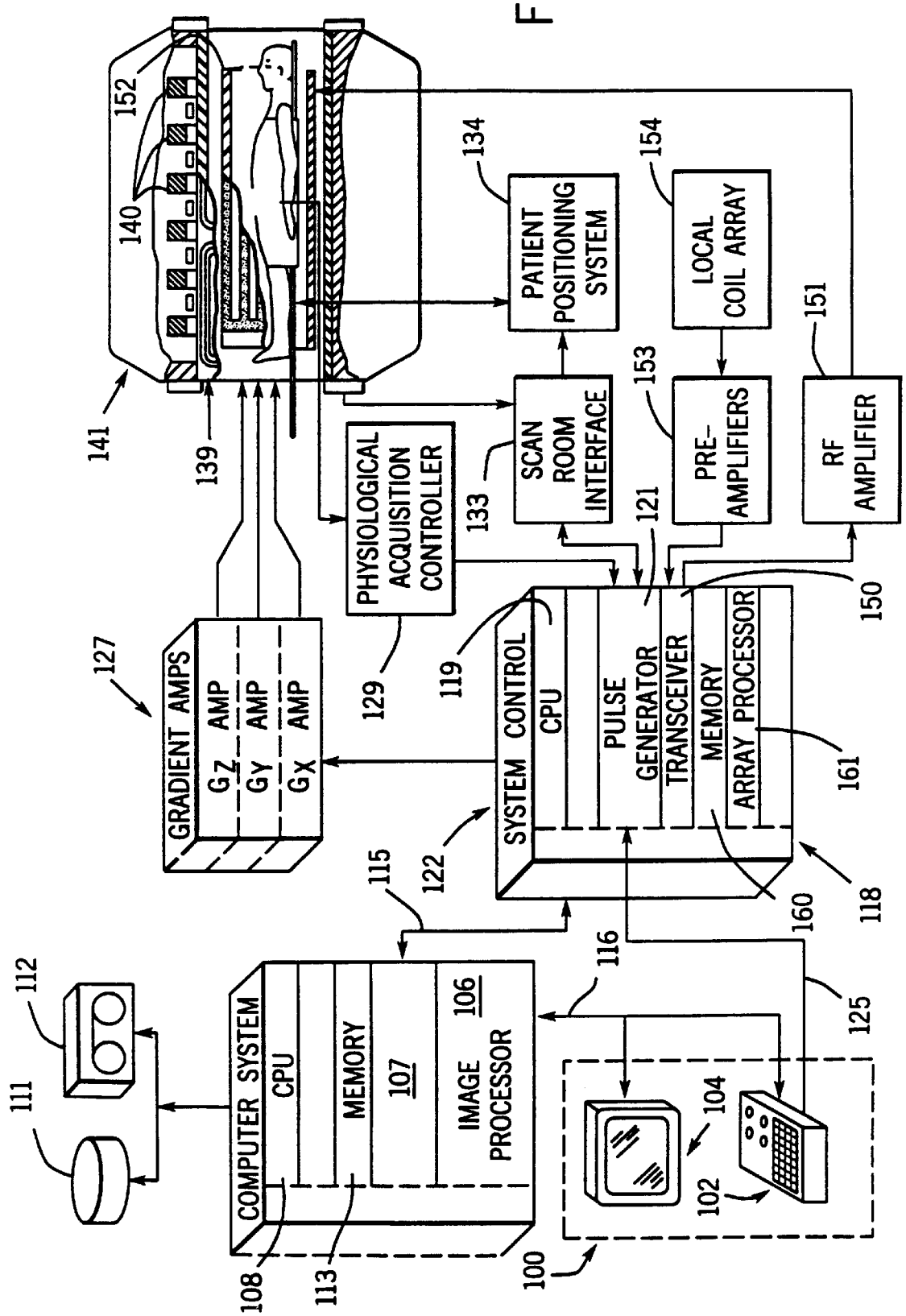
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane 118. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together 35 by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 is employed. The local coil array 154 is positioned around the patient anatomy to be imaged and it includes four separate coil elements (not shown in FIG. 1) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

Figure 2:
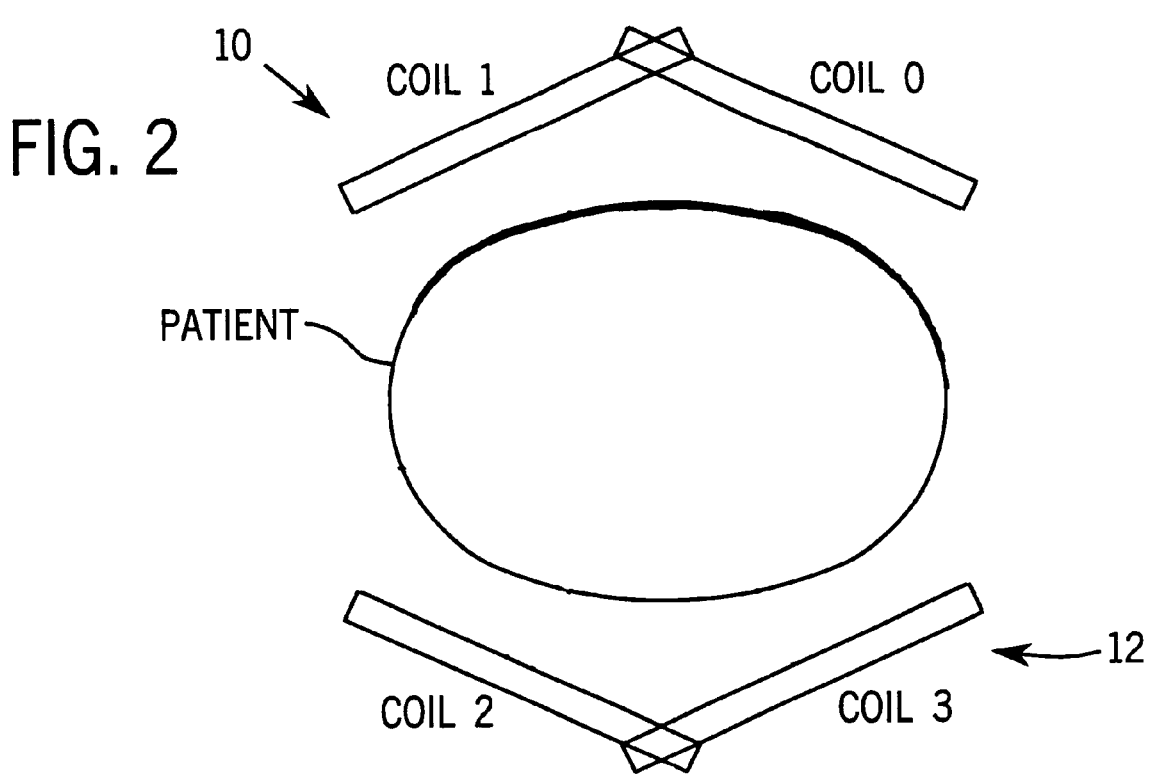
FIG. 2 is a pictorial representation of a four-element phased-array coil used with the MRI system of FIG. 1.

The local coil array 154 is similar to that disclosed in U.S. Pat. No. 4,825,162. Referring to FIG. 2, each multi-coil set consists of two flexible paddles 10 and 12, each with two surface coil elements fabricated with etched copper on a flexible plastic substrate, for a total of four coil elements. Each coil element is a rectangular loop, approximately 12×25 cm. Adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2.

The NMR signals picked up by the coil array 154 are digitized by the transceiver module 150 and transferred to a memory module 160 in the system control 122. When the image scan is completed the four resulting k-space data sets are processed as will be described in more detail below to produce an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 3:
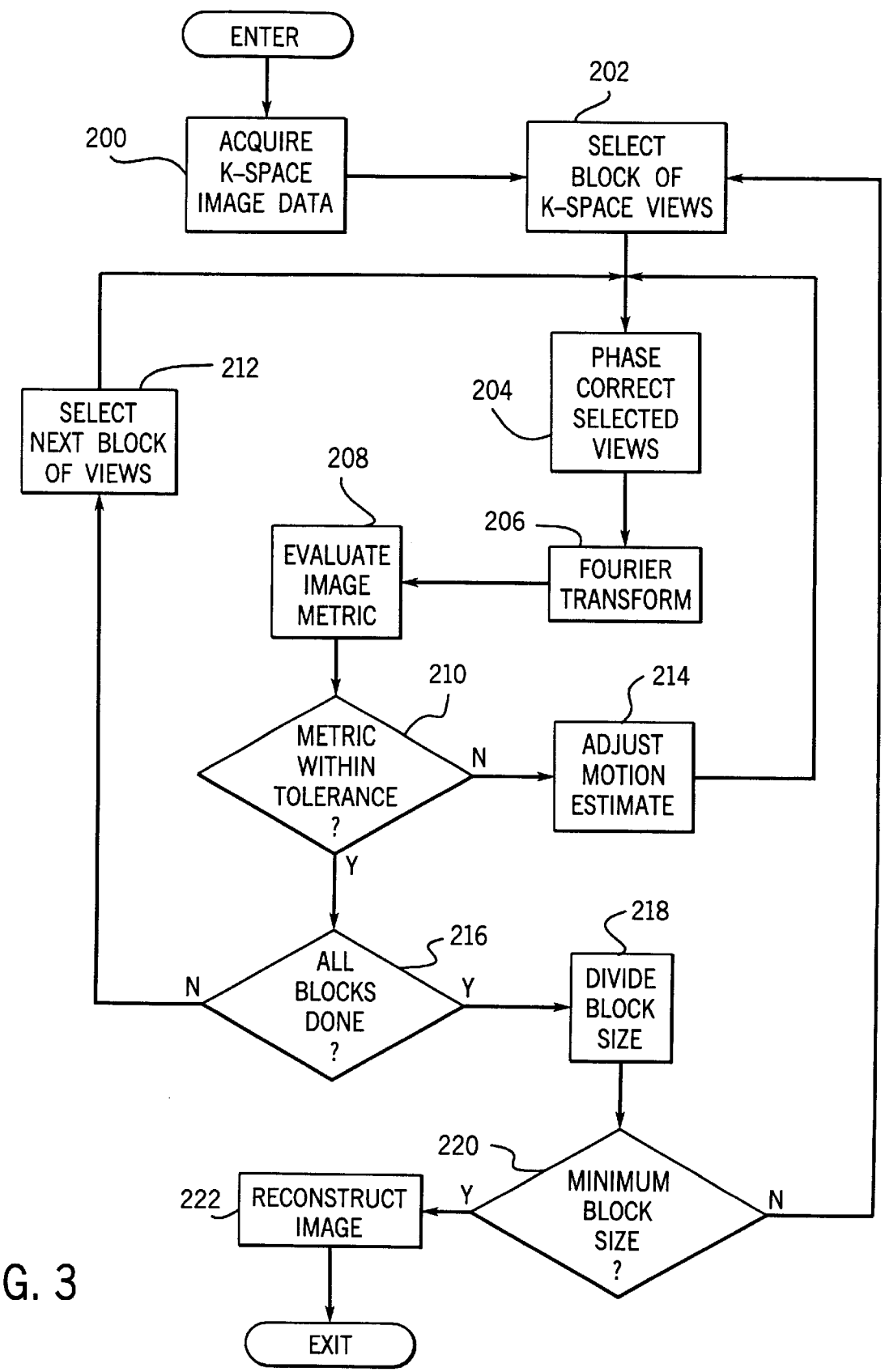
FIG. 3 is a flow chart of an autocorrection process used to correct images acquired wit the MRI system of FIG. 1 using the phase-array coils of FIG. 2.

The present invention is employed to autocorrect the acquired image data. Two preferred embodiments will be described below. Both of these embodiments employ an autocorrection procedure on an array of acquired data, and that procedure will now be described with reference to FIG. 3.

After a k-space image data set is acquired as indicated at process block 200, an initial block of k-space views is selected for correction as indicated at process block 202. In the preferred embodiment 64 views are selected in this initial block. The views in this block are then phase shifted as indicated at process block 204 based on an initial motion estimate. The altered k-space data set is then Fourier transformed as indicated at process block 206 to produce an image. As indicated at process block 208, the image metric is then calculated using this reconstructed image and the entropy of the gradient metric.

If the calculated metric is within a preset tolerance as determined at decision block 210, the block of 64 views has been corrected and the next block of 64 views is selected as indicated at process block 212 and the process repeats. Otherwise, the motion estimate for this block is adjusted at process block 214 and the process is repeated to evaluate the image metric with the corresponding adjusted phase shift.

All blocks of k-space views are separately adjusted in phase starting at the center of k-space and working outward. When the last block has been corrected as determined at decision block 216, the block size is reduced in size as indicated at process block 218 and the system branches back to process block 202 to repeat the steps on the smaller block size. The process is repeated and the block size is reduced until the minimum block size has been processed as determined at decision block 220. In the preferred embodiment block size is divided by two after each iteration, and the minimum block size is one view. The corrected k-space data set is then Fourier transformed to reconstruct an optimal image as indicated at process block 222.

It should be apparent that the autocorrection method can be employed on one, two or three axes of motion. In many clinical applications of the method, it has been discovered that processing only a single axis of motion is necessary. This reduces the processing time considerably. For example, if the motion is primarily along the phase encoding direction, a one dimensional FFT along the readout gradient direction can be performed once on the acquired k-space image data set before the autocorrection method is applied. The phase corrections in process 204 are made on this hybrid-space data set and the Fourier transform in process 206 can be a one-dimensional FFT along the phase encoding gradient direction.

Also, in many clinical applications only a small portion of the reconstructed image is clinically important. The autocorrection method may be modified in this situation to evaluate the image metric in process block 208 only in the selected region of interest. That is, the operator identifies the pixels in the region of interest and the image metric is calculated only on these pixels. This reduces processing time and in some cases improves the resulting image in the critical region. This also enables the correction of images in which the motion is different in different regions of the image. In such cases each region may be separately corrected using the autocorrection method. Simple, non-global motions of this type can be corrected, for example, in MR angiography where the motions are not complex.

In the first preferred embodiment of the invention the autocorrection process described above is performed on the k-space image data acquired with one of the four coil elements. The phase corrections made to each element in this one k-space image data set are then made to corresponding elements in each of the other three k-space image data sets. A single output image is then produced by Fourier transforming each of the four phase corrected k-space data sets to form four corresponding complex image data sets. A magnitude image is calculated from each of the four resulting complex images, and the four magnitude images are combined into a single magnitude image.

This combined output image $I_c$ is formed from the separate coil element magnitude images $I_i$:

$$I_c = \frac{\sum_{i=1}^{N} |I_i|^2}{\sum_{i=1}^{N} |I_i|}$$

where N is the total number of coil elements.

In the preferred embodiment with 4 coil elements, the magnitude of each pixel is squared and summed with the square of corresponding pixel elements in the other three magnitude images, and the resulting pixel value is divided by the sum of the four corresponding pixel values.

In a second preferred embodiment of the invention the autocorrection process described above is separately performed on each of the four acquired k-space image data sets. The four corrected k-space image data sets are then Fourier transformed and four magnitude images are calculated from the four resulting complex images. The four magnitude images are combined into a single magnitude image as described above. While this method produces a quality image, the calculations necessary to separately autocorrect the separate data sets is substantially more than that required by the first preferred embodiment described above.

What is claimed is:

1. An autocorrection method for correcting an MR image acquired with a plurality of rf coils positioned at different locations with respect to a subject to be imaged, the steps comprising:

a) acquiring a series of views with each of the rf coils to form a corresponding plurality of image data sets;

b) reconstructing an image from an image data set acquired with one of said plurality of rf coils;

c) calculating a gradient image from the reconstructed image;

d) evaluating the quality of the reconstructed image by calculating a cost function based on the gradient image;

e) iteratively minimizing the cost function by making corrections to views in the image data set and repeating steps b), c), d) and e)

f) correcting each of the image data sets acquired with the other of said plurality of rf coils using the corrections made to the one image data set; and g) combining the corrected image data sets to produce a single corrected image.

2. The method as recited in claim 1 in which step g) is performed by:

i) Fourier transforming each of the corrected image data sets;

ii) calculating magnitude images from the respective Fourier transformed corrected image data sets; and iii) combining the magnitude images to form a single magnitude image.

3. An autocorrection method for correcting an MR image acquired with a plurality of rf coils positioned at different locations with respect to a subject to be imaged, the steps comprising:

a) acquiring a series of views with each of the rf coils to form a corresponding plurality of image data sets:

b) autocorrecting an image data set acquired with one of said plurality of rf coils in an iterative process that evaluates the quality of an image reconstructed from the image data set as phase corrections are made to the views of the image data set;

c) correcting each of the image data sets acquired with the other of said plurality of rf coils with the phase corrections produced during the autocorrection process; and d) combining the corrected image data sets to produce a single corrected image.

4. The method as recited in claim 3 in which step d) is performed by:

i) Fourier transforming each of the corrected image data sets;

ii) calculating magnitude images from the respective Fourier transformed corrected image data sets; and iii) combining the magnitude images to form a single magnitude image.

* * * * *